United States Patent [19]

Guest

[11] Patent Number: 5,270,703

[45] Date of Patent: * Dec. 14, 1993

[54] BIPOLAR SIGNAL AMPLIFICATION OR GENERATION

[75] Inventor: Robert J. Guest, Duncan, Okla.

[73] Assignee: Halliburton Company, Duncan, Okla.

[*] Notice: The portion of the term of this patent subsequent to Feb. 16, 2010 has been disclaimed.

[21] Appl. No.: 965,891

[22] Filed: Oct. 23, 1992

Related U.S. Application Data

[63] Continuation of Ser. No. 577,397, Mar. 31, 1990, Pat. No. 5,187,473.

[51] Int. Cl.$^5$ .............................................. G01V 1/00
[52] U.S. Cl. ............................ 340/854.4; 340/855.8; 340/870.01; 340/870.19; 375/17; 307/127
[58] Field of Search ............. 340/854.4, 855.8, 870.01, 340/870.18, 870.19, 870.2; 375/17; 307/127

[56] References Cited

U.S. PATENT DOCUMENTS

| | | | |
|---|---|---|---|
| 2,354,887 | 8/1944 | Silverman et al. | 177/352 |
| 2,411,696 | 11/1946 | Silverman et al. | 177/352 |
| 3,319,147 | 5/1967 | Mapham | 321/6 |
| 3,473,131 | 10/1969 | Perkins | 315/76 |
| 3,794,906 | 2/1974 | Hoffman, Jr. et al. | 321/2 |
| 4,095,126 | 6/1978 | Hoffman et al. | 307/237 |
| 4,160,970 | 7/1979 | Nicolson | 340/18 LD |
| 4,244,015 | 1/1981 | Beebe | 363/8 |
| 4,316,132 | 2/1982 | Geppert | 318/723 |
| 4,339,791 | 7/1982 | Mitchell | 363/41 |
| 4,443,719 | 4/1984 | Planer et al. | 307/570 |
| 4,479,175 | 10/1984 | Gille et al. | 363/41 |
| 4,590,395 | 5/1986 | O'Connor et al. | 307/570 |
| 4,590,413 | 5/1986 | Gritter et al. | 318/803 |
| 4,691,203 | 9/1987 | Rubin et al. | 340/856 |
| 5,187,473 | 2/1993 | Guest | 340/854.4 |

Primary Examiner—J. Woodrow Eldred
Attorney, Agent, or Firm—Stephen R. Christian; E. Harrison Gilbert, III

[57] ABSTRACT

Amplification or generation of very low (and variable) frequency, low voltage, high current bipolar signals useful in electrical borehole telemetry systems is achieved using a duty cycle control device for causing the alternate direct application of a positive voltage and a negative voltage to an integrator. A commutated clamp is connected to the input of the integrator for switchably connecting the integrator directly into a current loop with the load, connected to the output of the integrator, when neither voltage is being applied to the input of the integrator.

3 Claims, 5 Drawing Sheets

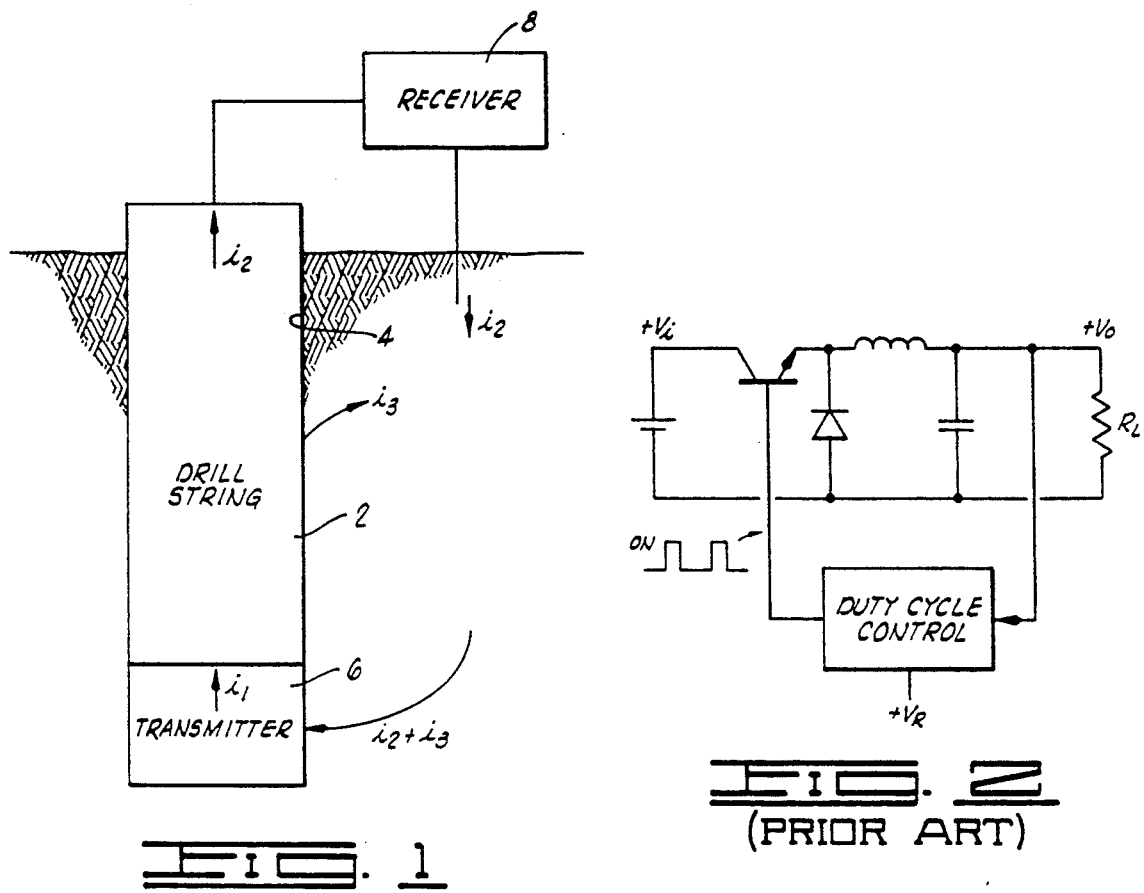
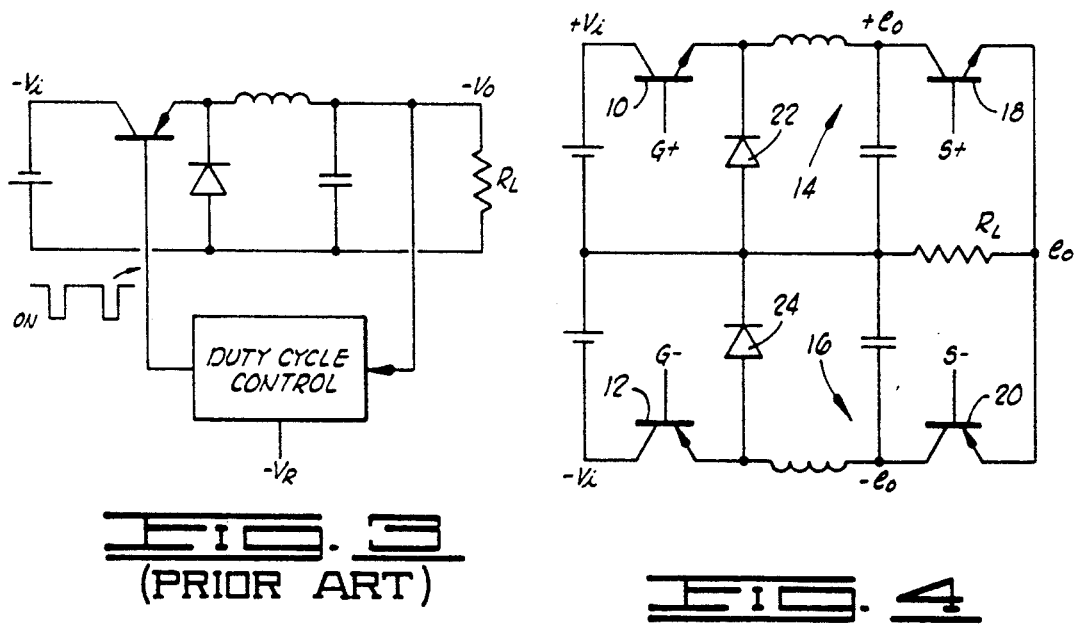

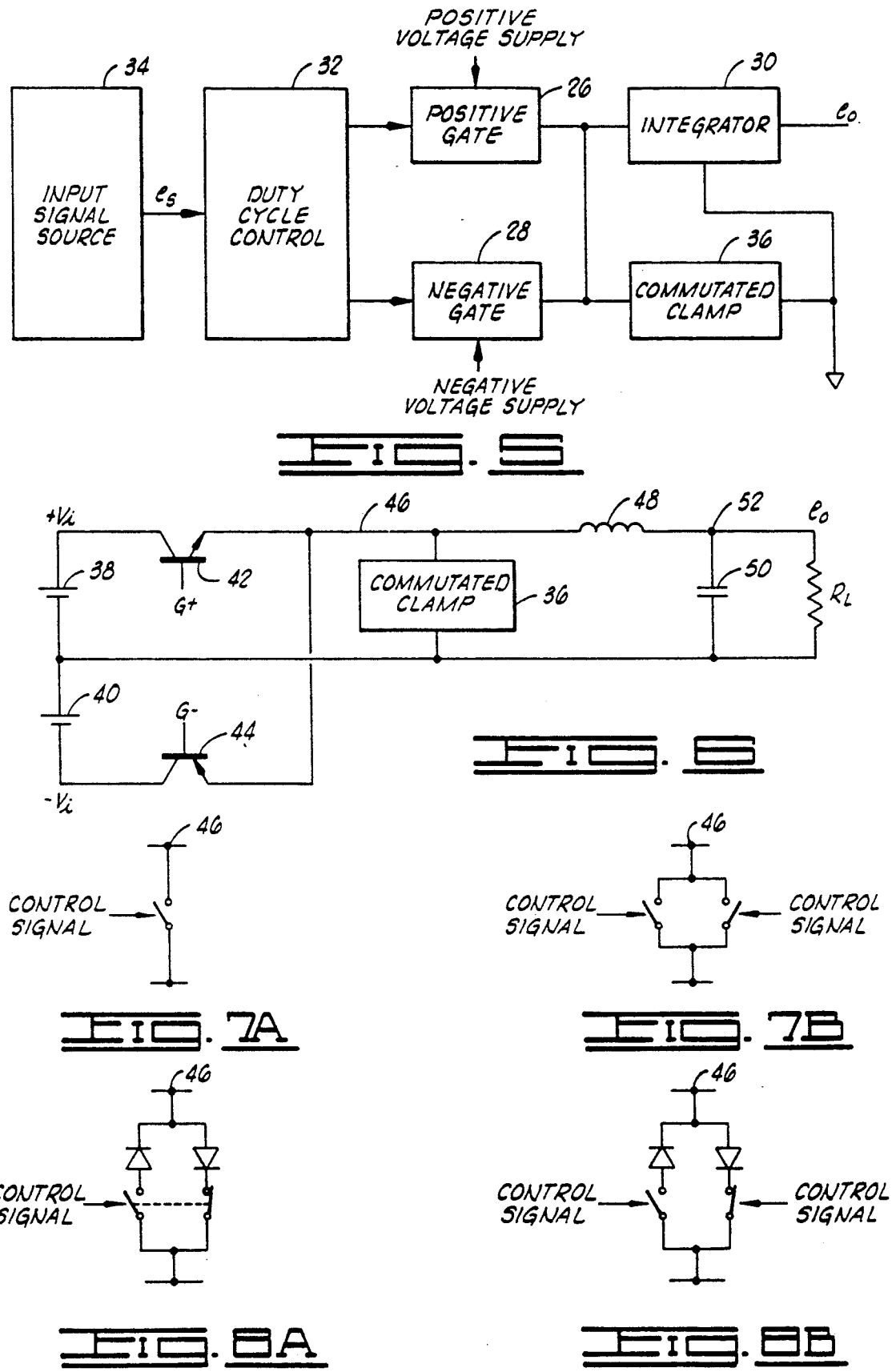

BIPOLAR SIGNAL AMPLIFICATION OR GENERATION

This is a continuation of copending application Ser. No. 07/577,397 filed on Mar. 31, 1990, now U.S. Pat. No. 5,187,473.

BACKGROUND OF THE INVENTION

This invention relates generally to a bipolar signal apparatus and method and more particularly, but not by way of limitation, to a system and method of transmitting a very low frequency signal on a drill string disposed in a well bore.

Amplification or generation of very low (and variable) frequency, low voltage, high current sine-wave signals is used in electrical borehole telemetry (EBT) systems and other applications. In EBT systems, for example, a transmitter connected to a drill string and lowered into a well bore transmits a very low frequency signal through the drill string to a receiver at the surface. The signal is encoded with information such as from pressure or temperature sensors also located within the well bore. The current loop of the signal propagation includes the drill string and the earth as indicated by the current representations $i_1$, $i_2$, $i_3$ in FIG. 1. Such very low frequency signals can also be transmitted from the surface to control something downhole.

In EBT, a voltage is typically impressed across an insulating gap such that a current is caused to flow in the conductor as shown in FIG. 1. Because the transmission path in the earth is a very low impedance, a low voltage, high current signal is required for successful operation. It is also known that a very low frequency sine-wave signal is well suited to such telemetry. An important feature of such a sine-wave signal is that it be symmetrical about zero potential such that no power is lost due to direct current flow in the conductor. If the telemetered signal is to convey information, it must also be capable of being appropriately modulated.

One type of downhole telemetry apparatus is disclosed in U.S. Pat. No. 4,691,203 to Rubin et al. The Rubin et al. apparatus uses pulse width modulation in converting an input signal to an output signal for transmission from a downhole drill string location. A high frequency impedance matching transformer is used in the conversion technique. It would be preferable not to have to use a transformer so that cost and space requirements could be reduced.

The circuit shown in FIG. 2 is a step-down switching type voltage regulator circuit that is commonly used to transform a positive dc power source to a lower positive dc output voltage. A similar circuit configured for negative voltages is illustrated in FIG. 3. In the circuits of both FIGS. 2 and 3, the power source voltage is periodically connected to a load $R_L$ through a gate device and an inductor-capacitor integrating network in response to a gate on-off control signal provided by a duty cycle control circuit. Although the gate device is illustrated as a bipolar transistor, any suitable switching device can be used. When the circuits of FIGS. 2 and 3 are configured to deliver a high current signal to the load, a number of such gate devices may be combined in parallel to share the load current and reduce ohmic related gate power loss. The gate control signal is typically a series of rectangular pulses in time which are controlled to represent a variable on-off duty cycle.

The duty cycle is normally related to the difference of the output voltage and a stable selected reference voltage. When the gate is on, current pulses are delivered to the inductor. When the gate is turned off, the cessation of current flow in the inductor drives its input side to an opposite polarity voltage relative to the output voltage. The purpose of the diode in the circuits of both FIGS. 2 and 3 is to clamp the inductor input to ground and thereby to impress the inductor voltage on the load. When the gate is off, therefore, current is delivered to the load by the inductor from the energy stored in its field during a prior period when the gate was on. A more detailed analysis of the operation of the basic circuit indicates that the output voltage-to-power source voltage is proportional to the gate duty cycle, and that no fundamental circuit efficiency limitation is inherent in its operation.

The linear gate duty cycle-to-output voltage relationship, inherently high circuit power efficiency and minimal quantity of components are features of the step-down switching regulators of FIGS. 2 and 3 that are desirable in the amplification or generation of an EBT signal. In particular, the absence of the requirement for a signal voltage level converting transformer is very desirable. Such transformers, suitable for use with the low frequency signals that are required for proper operation of an EBT system, are typically very large. The Rubin et al. apparatus was trying to get away from this very large type of transformer by using a high frequency transformer; however, even such a high frequency transformer requires space which is at a premium in a downhole location.

Although the circuits shown in FIGS. 2 and 3 have desirable characteristics, they produce dc outputs, and an ac output is required in an EBT system. Thus, there is the need for a non-transformer type of bipolar signal system which in a preferred embodiment is capable of producing very low frequency signals for transmission on a drill string.

SUMMARY OF THE INVENTION

The present invention overcomes the above-noted and other shortcomings of the prior art and meets the aforementioned needs by providing a novel and improved bipolar signal apparatus and method and, more particularly, a system and method of transmitting a very low frequency signal on a drill string disposed in a well bore.

Advantages of the present invention include: relatively small number of circuit components, high circuit efficiency, linear input signal voltage-to-output signal voltage relationship, step down power supply voltage-to-output signal voltage without a voltage conversion or impedance matching transformer, variable operating frequency capability, no resonant circuits required, easily adaptable for high signal current requirements, and well suited for different types of modulation.

In its broader aspects, the present invention provides a bipolar signal apparatus comprising: a first polarity voltage source; a second polarity voltage source; a first gate switch, connected to the first polarity voltage source; a second gate switch, connected to the second polarity voltage source; an integrator connected to the first and second gate switches; control means, connected to the first and second gate switches, for operating the first and second gate switches so that first polarity and second polarity voltages are periodically alternately communicated through the first and second gate switches, respectively, to the integrator; and a commutated clamp connected to the integrator. The apparatus can also include feedback means for providing a feedback signal so that an alternating bipolar output from the integrator is maintained at a constant voltage or a constant current or a constant power.

In more particular aspects, the present invention provides a well bore signal transmission system and a method of transmitting a very low frequency signal on a drill string disposed in a well bore. The transmission system comprises: an electrically conductive drill string disposed in a well bore; and a transmitter connected to the drill string so that the transmitter is disposed in the well bore with the drill string, the transmitter including: duty cycle control means for receiving an input signal (such as one representing information to be transmitted to the mouth of the well bore) and for providing a control signal in response to the input signal; a first voltage source, having a positive terminal and a negative terminal; a second voltage source, having a positive terminal connected to said negative terminal of said first voltage source, and also having a negative terminal; a first transistor including: a first terminal, connected to the positive terminal of the first voltage source; a second terminal; and a third terminal, connected to the duty cycle control means; a second transistor including: a first terminal, connected to the negative terminal of the second voltage source; a second terminal, connected to the second terminal of the first transistor; and a third terminal, connected to the duty cycle control means; an inductor connected at one end to the second terminals of the first and second transistors; a capacitor connected at one end to the other end of the inductor, and the capacitor connected at its other end to the junction between the negative terminal of the first voltage source and the positive terminal of the second voltage source, and a selected one of said ends of said capacitor connected to said drill string; and clamp means for providing a current conductive circuit in electrical parallel with the inductor and the capacitor when neither the first transistor nor the second transistor is conducting through the first and second terminals thereof in response to the duty cycle control means.

The method comprises: generating a respective first pulse width modulated control signal representing each positive portion of a very low frequency signal, and generating a respective second pulse width modulated control signal representing each negative portion of the very low frequency signal; applying a positive voltage to an input of an integrator in response to each first pulse width modulated control signal; applying a negative voltage to the input of the integrator in response to each second pulse width modulated control signal; and conducting a very low frequency current through a drill string, connected to the integrator, in response to the positive and negative voltages applied to the input of the integrator, including switchably connecting the integrator directly into a current loop with the drill string when neither the first pulse width modulated control signal nor the second pulse width modulated control signal causes the positive or negative voltage to be applied to the input of the integrator.

Therefore, from the foregoing, it is a general object of the present invention to provide a novel and improved bipolar signal apparatus and method and it is a more particular object to provide a system and method of transmitting a very low frequency signal on a drill string disposed in a well bore. Other and further objects, features and advantages of the present invention will be readily apparent to those skilled in the art when the following description of the preferred embodiments is read in conjunction with the accompanying drawings.

BRIEF DESCRIPTION OF THE DRAWINGS

FIG. 1 is a schematic representation of a well bore environment in which the present invention can be used.

FIG. 2 is a schematic circuit diagram of a prior art dc circuit.

FIG. 3 is a schematic circuit diagram of another prior art dc circuit.

FI. 4 is a schematic circuit diagram of a circuit combining the circuits of FIGS. 2 and 3.

Figure 5:
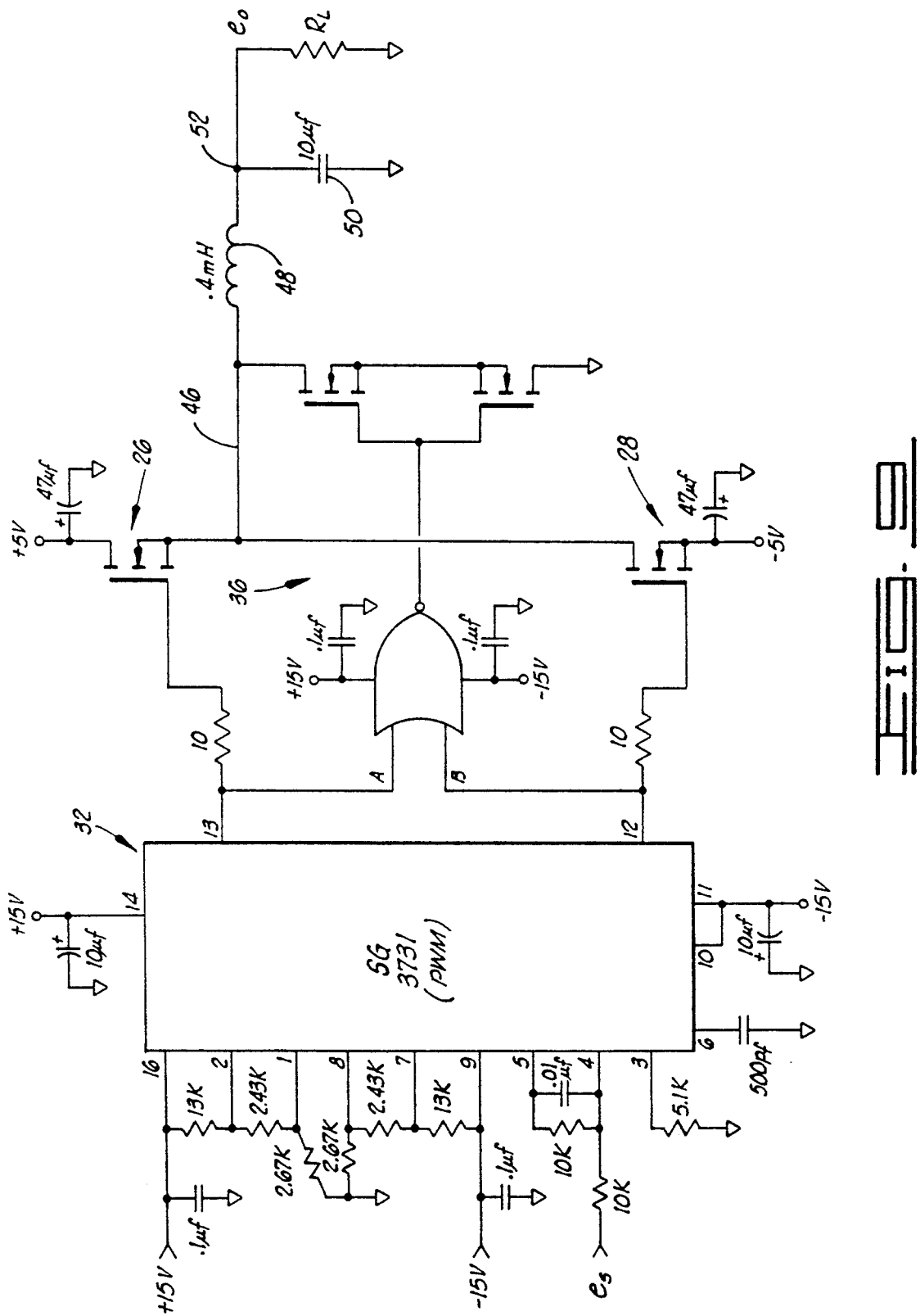

FIG. 5 is a block diagram of a bipolar signal apparatus of the present invention.

FIG. 6 is a schematic circuit diagram of an implementation of the embodiment of the present invention shown in FIG. 5.

FIGS. 7A-8B schematically depict different types of commutated clamp implementations.

FIG. 9 is a schematic circuit diagram of a specific implementation of the FIG. 5 embodiment.

Figure 10:
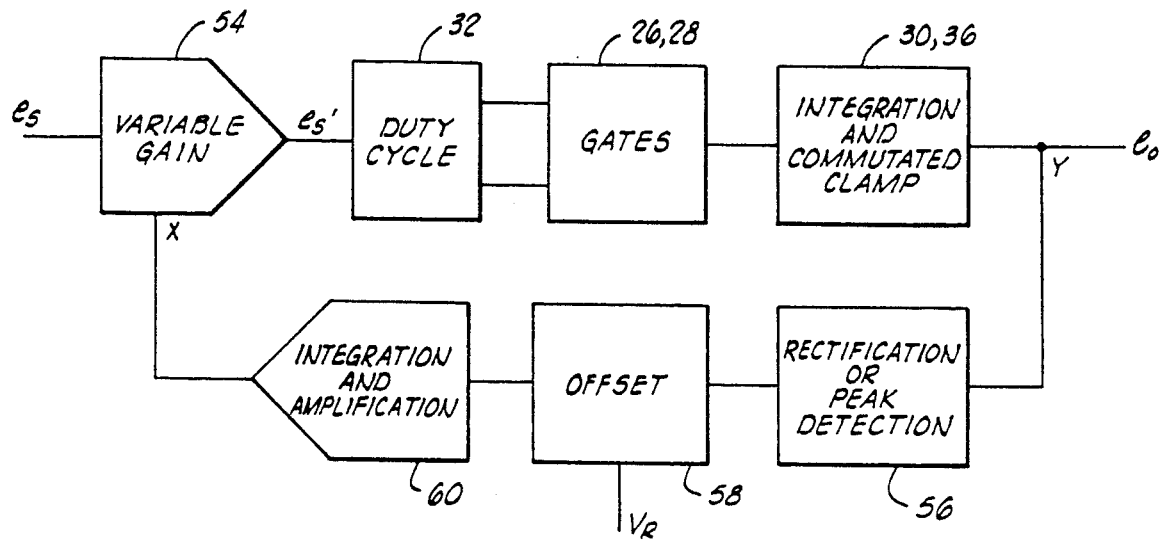

FIG. 10 is a block diagram of one type of feedback circuit which can be used with the embodiment shown in FIG. 5.

Figure 11:
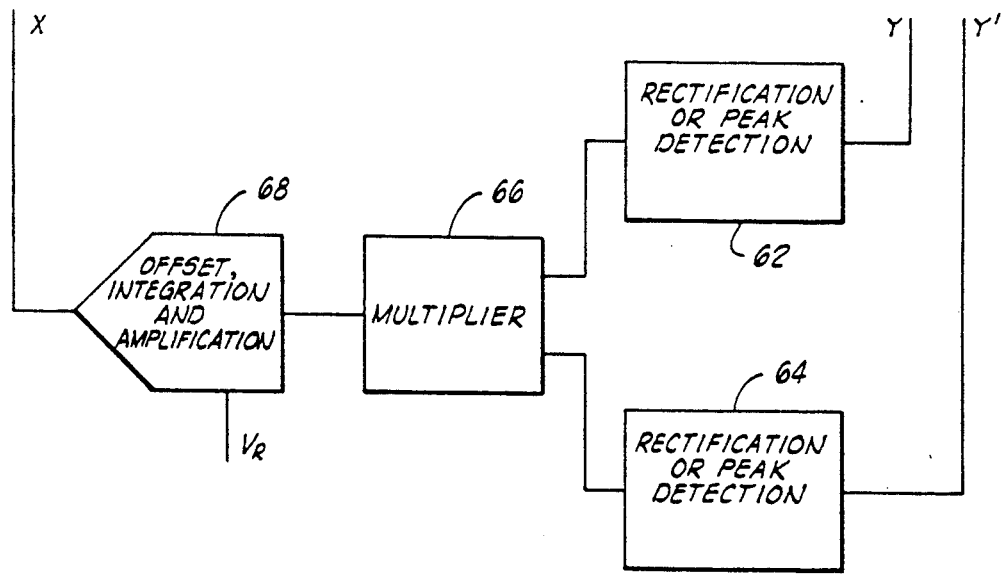

FIG. 11 is a block diagram of another type of feedback circuit which can be used with the embodiment of FIG. 5.

Figure 12:
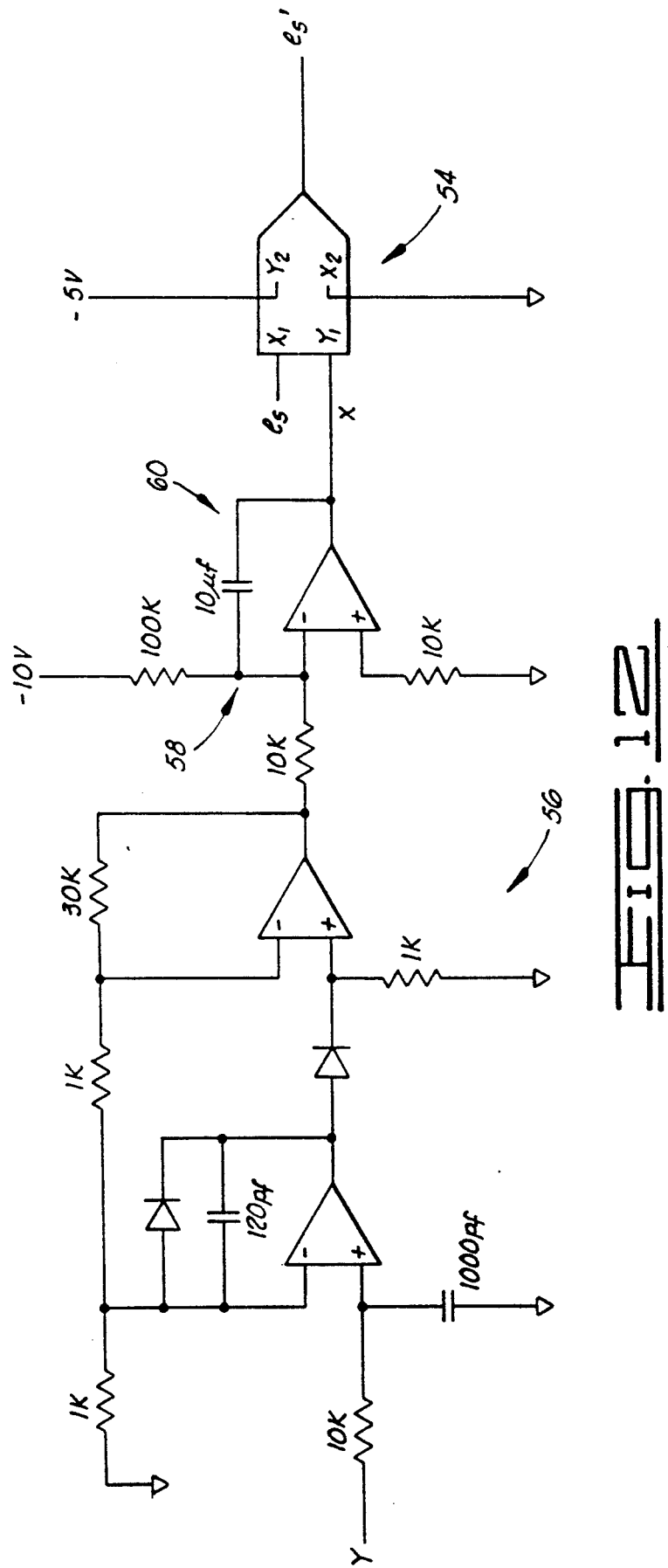

FIG. 12 is a schematic circuit diagram of a specific implementation of the block diagram of FIG. 10.

DETAILED DESCRIPTION OF THE PREFERRED EMBODIMENTS

In a particular aspect depicted in FIG. 1, the present invention provides a well bore signal transmission system comprising an electrically conductive drill string 2 disposed in a well bore 4 and further comprising a transmitter 6 connected with an electrically insulating gap to the drill string 2 so that the transmitter 6 is disposed in the well bore 4 with the drill string 2 but insulated therefrom. The transmitter 6 transmits signals through the drill string 2 to a receiver 8 which is not a part of the present invention. In broader aspects of the present invention, the transmitter 6 can be used in other environments.

The transmitter 6 provides both amplification and a bipolar output signal without using a transformer. One way which the transmitter 6 could be implemented would be to combine the prior art circuits shown in FIGS. 2 and 3 in a manner illustrated in FIG. 4.

If the feedback voltage regulating circuits of FIGS. 2 and 3 are removed from the basic circuit, the output voltages can be controlled in response to a gate drive signal with a preferred duty cycle, namely, one which is proportional to the desired output voltage. One method of accomplishing this would be to replace the dc voltage reference with an analog of the desired output voltage. If the preferred duty cycle, in time sequence, is proportional to the preferred output voltage, linear signal amplification or generation results. Typically, the preferred output voltage is that of a sine variation with respect to time. The method of relating the duty cycle to the preferred output signal may be that of pulse width modulation or any suitable encoding method.

A fundamental restriction of either the positive or negative voltage circuits of FIGS. 2 and 3, however, is that they can generate an output voltage of only one polarity. As mentioned, these two circuits can be combined as shown in FIG. 4. Gate drive control signals G+ and G− operate transistors 10, 12 respectively, to conduct positive and negative current, respectively, in circuit with inductor-capacitor integrators 14, 16, respectively. Current from these integrators is alternately provided to the load $R_L$ through output commutation transistors 18, 20 in cooperation with diodes 22, 24, respectively.

If the gate drive control signals to the positive and negative circuits of the FIG. 4 embodiment are alternatively driven in correspondence with the positive and negative portions of the desired output signal and in proportion to the instantaneous desired output voltage, bipolar operation can be achieved. For a sine-wave output signal, the positive and negative circuits would be used in alternate half cycles, and their outputs would be commutated to the load in alternate half cycles of the desired sine wave. It is preferred that the maximum gate on time be small with respect to the output signal period and that the inductor capacitor integration time constant be large enough to provide acceptable filtering of the voltage pulses and small enough to allow an acceptable output signal rate-of-change. These are easily satisfied if the pulse repetition frequency is two or more orders of magnitude greater than that of the desired output signal; one order of magnitude greater is a minimum acceptable ratio.

Although the circuit of FIG. 4 could be used in the EBT environment illustrated in FIG. 1, the requirement for commutation switching at the load is undesirable because the signal at the load is characteristically of high current (and low voltage) and the current related losses encountered in the output commutating switches will reduce the maximum achievable circuit efficiency.

FIG. 5 illustrates a preferred embodiment of the transmitter 6 of the present invention. This combines the desired features of the circuits of FIGS. 2 and 3 in a manner that does not require commutation at the load. The positive and negative gate outputs of the FIG. 5 circuit are combined to provide an input to a shared integrator. Commutation is provided by alternating the gate control signals to the positive and negative gate devices and by a commutated clamp connected at the input of the integrator. For the case of sine-wave amplification or generation, appropriate signals having duty cycle versus time proportional to each half cycle are alternately applied to the gate control inputs during the appropriate half cycles of the desired output sine-wave signal.

The feature of the circuit of FIG. 5 that permits this combination is the commutated clamp that replaces the separate diodes of the individual positive and negative unipolar circuits shown in FIGS. 2 and 3. If the diodes of these two circuits were simply combined in parallel in the circuit of FIG. 5, the input of the integrator would always be connected to ground.

As shown in FIG. 5, positive gate 26 is connected to a positive voltage supply and negative gate 28 is connected to a negative voltage supply. Respective positive and negative voltages from these supplies are connected to the input of integrator 30 in response to duty cycle control 32 which is responsive to input signal source 34 providing signal $e_s$. Commutated clamp 36 is connected across integrator 30. If the input signal source is an oscillator, the circuit of FIG. 5 functions as a signal generator. If the input signal source is an information containing signal, such as an electrical signal representing pressure or temperature measured in a well bore, then the remainder of the circuit in FIG. 5 functions as a signal amplifier whose input is $e_s$ and whose output is $e_o$. A preferred embodiment of the amplification portion of the circuit shown in FIG. 5 is shown in FIG. 6.

Batteries 38, 40 are connected to provide two different polarity voltage sources. This is achieved in the FIG. 6 embodiment by connecting the negative terminal of the battery 38 to the positive terminal of the battery 40. The positive terminal of the battery 38 is connected to the collector of a bipolar transistor 42 implementing positive gate 26, and the negative terminal of the battery 40 is connected to the collector of a bipolar transistor 44 implementing negative gate 28. The bases of the transistors 42, 44 are connected to the duty cycle control means. The emitters of the transistors 42, 44 are connected together at a node 46. "Collector," "base" and "emitter" refer to the respective terminals of bipolar transistors 42, 44 and they also are intended to encompass corresponding terminals on other types of transistors which could be used, such as field effect transistors.

In the FIG. 6 embodiment, integrator 30 is implemented by an inductor 48 and a capacitor 50. The inductor 48 has one end connected to the node 46; and it has another end connected at a node 52 to the capacitor 50, across which load $R_L$ is to be connected. With reference to the environment shown in FIG. 1, the junction or node 52 of the inductor 48 and the capacitor 50 is connected to a portion of the transmitter which is in contact with the well bore and the other end of the capacitor 50 is connected to the junction of the batteries 38, 40 and to the drill string 2. In an alternate embodiment, the node 52 is connected to drill string 2 while the junction of the capacitor 50 and the batteries 38, 40 is connected to a portion of the transmitter which is in contact with the well bore.

Commutated clamp 36 is connected across the inductor 48 and capacitor 50 for providing a current conductive circuit in electrical parallel with the inductor and capacitor when neither the transistor 42 nor the transistor 44 is conducting through its collector and emitter terminals in response to the duty cycle control means. Commutated clamp 36 will be more fully described hereinbelow.

The duty cycle control means in the preferred embodiment as used in the environment illustrated in FIG. 1 receives an input signal representing information to be transmitted to the mouth of the well bore. In response to the input signal, the duty cycle control means provides a control signal. In the preferred embodiment, the duty cycle control means includes conventional pulse width modulation means for providing pulse width modulated actuating signals to the bases of the transistors 42, 44. The signals provided to the transistors 42, 44 turn them on (conductive) and off (non-conductive) in response to the pulse width modulation pulses occurring during the respective half cycles for a sine wave. That is, during a positive half cycle, the transistor 42 is turned on and off in accordance with the pulse width modulation to communicate the positive voltage source to the integrator containing the inductor 48 and the capacitor 50. Likewise, during the negative half cycles, the transistor 44 communicates the negative voltage source to the inductor 48 and the capacitor 50. Thus, the two different polarity voltages and currents are periodically alternately communicated through the respective gate switches to the integrator.

Commutated clamp 36 provides means for delivering the energy stored in the inductor field during gate-on intervals to the load during gate-off intervals. This is accomplished by clamping the inductor into a current conducting circuit with the load (by clamping the inductor input to the common electrical ground) during periods when neither gate is on. This function, important for efficient circuit operation, is well known in the switching power converter art. Since conventional switching power converters are unipolar, the function described above can be provided by a diode connected to block the voltage applied by the gate yet to conduct current from ground to the load (and thus to deliver the energy stored in the inductor field) during gate-off periods. In the present invention, however, at particular times during the process of amplifying bipolar signals, both positive and negative source voltages will be gated to the inductor input. Accordingly, a simple forward conducting, reverse blocking device such as a diode cannot be used alone. Two diodes, parallel connected in opposing polarity, cannot be used alone because the gate voltage would always be shorted. Also, in a specific preferred embodiment of the present invention wherein a low voltage-high current output is needed, the diode offset voltage would substantially reduce the circuit's power efficiency. A low off-set voltage, low ohmic loss commutated clamp is preferred.

Representations of several embodiments for implementing commutated clamp 36 are illustrated in FIGS. 7 and 8. In each implementation the commutated clamp, in the interest of efficiency, preferably is capable of holding the inductor input very near ground potential while carrying relatively high current. It is also preferable that it be capable of switching from a clamped state to an unclamped state in a time that is commensurate with the on-off switching time of the gate switches. In operation, the clamps are on at all times when the positive and negative gates are off, and off when either gate is on. The switches and diodes illustrated in FIGS. 7 and 8 represent the intended function only, and may be implemented with any combination of appropriate devices readily known in the art.

FIGS. 7A and 7B illustrate two implementations which are responsive to one and two control signals, respectively. The control signals are on or off in periods of time related to the gate on and off times. Thus, the commutation control signals for closing the represented switches are the complement of the gate drive signals G+ and G− of FIG. 6.

FIGS. 8A and 8B illustrate a type of clamp which is unidirectionally conductive during the operative half-cycle of each respective gate switch. That is, the left diode as viewed in FIGS. 8A and 8B will be connected into the circuit and the right diode disconnected from the circuit when the positive gate is used. The left diode will be disconnected and the right diode connected when the negative gate is used.

The circuits of FIGS. 8A and 8B can also be used in a self commutating manner. Such operation could be achieved by a sensing means at the inductor input (node 46) causing the clamp to switch from on to off when either gate is driving the inductor.

FIG. 9 is a schematic circuit diagram of a specific circuit employing the commutated clamp type of FIG. 7A. The particular implementation of FIG. 9 is a low current prototype form, but test results indicate that a high current version of this circuit should be well suited to EBT signal amplification or generation. Like parts between FIGS. 5, 6 and FIG. 9 are indicated by the use of like reference numerals.

The basic apparatus illustrated in FIG. 5 does not show a feedback loop; however, the output $e_o$ can be controlled to provide constant voltage, constant current or constant power by using a suitable known type of feedback loop. These include the use of a variable gain amplifier 54 (FIG. 10) having the input signal $e_s$ as one input. The other input is received from the feedback loop.

The feedback loop shown in FIG. 10 provides a means for obtaining a preferred output signal voltage that is invariant with output load resistance. In operation, an appropriate signal, denoted Y, is obtained from the amplifier signal output. Signal Y is proportional to the instantaneous signal output voltage. Because the output signal is bipolar and a unipolar control signal is required, the signal Y is first rectified as indicated by block 56 in FIG. 10. The rectified signal is then offset by an appropriate reference signal $V_R$ (block 58) to represent a relative measure of the output ac signal as a quasi-dc error signal. The quasi-dc error signal is then integrated and amplified (block 60). In practice, the integration time constant is preferably at least several times greater than the period of the bipolar output signal. Finally, the processed quasi-dc error signal is applied to the control input, denoted X in FIG. 10, of the variable gain amplifier 54. The combined result of the operation of the described functions is to stabilize the output signal voltage relative to a predetermined amplitude established by $V_R$. In effect, the amplifier source resistance is reduced to zero so that output load resistance variation does not result in an output voltage variation.

In a second application of feedback control, the same function obtains except the output $e_o$ is controlled to provide an output ac current that is independent of output load resistance. The only difference in implementation is that the signal Y is proportional to the output ac current rather than to the ac voltage. Any conventional current sensing means can provide the required signal. Also, in the operation of the bipolar amplifier, a signal that is proportional to the amplifier output current can be obtained by appropriate sensing in any one or more of the gate or commutated clamp elements. Subsequent processing is equivalent to that of the constant voltage feedback application except that a constant amplifier output ac current proportional to the reference $V_R$ is provided. FIG. 12 is a schematic circuit diagram of a specific implementation of a constant current feedback loop wherein variable gain amplifier 54 consists of a conventional multiplier circuit. In the illustrated configuration, the multiplier output is equal to $e_s(X+5)/10$. As error signal X may vary from −5 V to +5 V, output signal $e_s'$ may vary from 0 to $e_s$ such that a constant ac output current independent of load resistance may obtain.

The third type of feedback loop, one by which a constant power output is obtained, is illustrated in FIG. 11. This provides an output power level that is independent of output load resistance. Signals Y and Y' representative of the amplifier's output voltage and current are processed as described in the previous types of feedback loops to provide both voltage and current related quasi-dc signals (blocks 62, 64). Subsequently a single quasi-dc signal proportional to the product of these two signals is obtained by conventional signal multiplier processing (block 66). The resultant signal, which is proportional to the output signal power, is finally processed relative to the reference $V_R$ (block 68) and applied to the variable gain amplifier at input X. This achieves a constant amplifier output ac power proportional to the reference $V_R$.

The circuits and functions described hereinabove can be readily implemented with many types of conventional circuit devices, such as bipolar transistors, field effect transistors, diodes and other common circuit components. Also, a plurality of devices can be connected in parallel, for instance in the gate switches or commutated clamp, so that high current flow can be shared among the devices.

Although the operation of the present invention has been generally described hereinabove, the operation with respect to transmitting a very low frequency signal on the drill string 2 disposed in the well bore 4 will be specifically described. Within the well bore 4 there will be generated a very low frequency signal by some other device, which signal contains information to be transmitted to the surface. For example, a downhole pressure sensor output may be used to encode a very low frequency oscillator signal so as to convey pressure data. This signal will need to be amplified for transmission up the drill string 2 to the receiver 8. Using the present invention, a respective first pulse width modulated control signal is generated in response to each positive half cycle of the encoded very low frequency signal. A respective second pulse width modulated control signal is generated in response to each negative half cycle of the encoded very low frequency signal. . This is accomplished through the duty cycle control means 32 in a known manner. These signals are series of pulses whose widths are related to the amplitude of the encoded very low frequency input signal.

In response to the first pulse width modulated control signal, a positive voltage/current will be applied/conducted to an input of the integrator 30. This is generally not continuous because the pulse width modulated control signal will have alternate on and off periods within the respective positive half cycle. Similarly, during each negative half cycle of the encoded very low frequency signal, a negative voltage/current is applied/conducted to the input of the integrator 30 in response to the second pulse width modulated control signal. With respect to the embodiment illustrated in FIG. 6, the voltages/currents are applied/conducted by actuating the respective transistors 42, 44 implementing gate switches 26, 28, with the first pulse width modulated control signal and the second pulse width modulated control signal, respectively. That is, G+ is implemented by the aforementioned first pulse width modulated control signal and G— is implemented by the aforementioned second pulse width modulated control signal.

At the integrator 30 of the transmitter, a very low frequency current is provided to the drill string 2, which is connected to the output (node 52 in FIG. 6) of the integrator 30, in response to the positive and negative inputs to the integrator 30. This includes switchably connecting the integrator 30 directly into a current loop with the drill string 2 when neither the first pulse width modulated control signal nor the second pulse width modulated control signal causes the positive or negative voltage/current to be applied/conducted to the input of the integrator 30. For the preferred embodiments, this switchably connecting step includes switchably connecting the input (node 46 in FIG. 6) of the integrator 30 to electrical ground such as is illustrated in the particular implementation of FIG. 9 and more generally in FIG. 5. More generally, the input of the integrator is connected into a current conductive circuit with the load.

Thus, the present invention is well adapted to carry out the objects and attain the ends and advantages mentioned above as well as those inherent therein. While preferred embodiments of the invention have been described for the purpose of this disclosure, changes in the construction and arrangement of parts and the performance of steps can be made by those skilled in the art, which changes are encompassed within the spirit of this invention as defined by the appended claims.

What is claimed is:

1. An apparatus for transmitting a bipolar signal, comprising:

a first polarity voltage source;

a second polarity voltage source;

a first gate switch, connected to said first polarity voltage source;

a second gate switch, connected to said second polarity voltage source;

integrator means connected to said first and second gate switches for providing outputs for connecting to an external primary load through which a bipolar signal is to be conducted;

control means, connected to said first and second gate switches and having operating and non-operating periods, for operating during said operating periods at least one of said first and second gate switches so that first polarity and second polarity voltage are periodically alternately communicated through said first and second gate switches, respectively, to said integrator means; and commutation means connected to said integrator means for causing a bipolar signal to be conducted through a connected external primary load during said non-operating periods of said control means.

2. An apparatus for transmitting a bipolar signal, comprising:

a first polarity voltage source;

a second polarity voltage source;

a first gate switch, connected to said first polarity voltage source;

a second gate switch, connected to said second polarity voltage source;

an integrator connected to said first and second gate switches, said integrator providing an output through which a bipolar signal is transmitted to a connected external load;

control means, connected to said first and second gate switches, for operating said first and second gate switches so that first polarity and second polarity voltages are periodically alternately communicated through said first and second gate switches, respectively, to said integrator; and a commutated clamp connected to said integrator so that the bipolar signal is generated in response to said control means, said commutated clamp and said integrator.

3. A well bore signal transmission system, comprising:

an electrically conductive tubing string disposed in a well bore;

a first polarity voltage source;

a second polarity voltage source;

a first gate switch, connected to said first polarity voltage source;
a second gate switch, connected to said second polarity voltage source;
integrator means for connecting to said first and second gate switches and to said tubing string to that a bipolar signal is transmitted on said tubing string through said integrator means;
control means, connected to said first and second gate switches, for operating said first and second gate switches so that first polarity and second polarity voltages are periodically alternately communicated through said first and second gate switches, respectively, to said integrator means; and
commutation means for operating with said integrator means so that the bipolar signal is generated in response to said control means, said commutation means and said integrator means.

* * * * *